(12) United States Patent
Peng et al.

(10) Patent No.: US 10,803,795 B2
(45) Date of Patent: Oct. 13, 2020

(54) DISPLAY PANEL AND METHOD FOR PREPARING THE SAME, DISPLAY DEVICE

(71) Applicants: ORDOS YUANSHENG OPTOELECTRONICS CO., LTD., Ordos (CN); BOE TECHNOLOGY GROUP CO., LTD., Beijing (CN)

(72) Inventors: Liman Peng, Beijing (CN); Yan Wu, Beijing (CN); Qi Liu, Beijing (CN)

(73) Assignees: ORDOS YUANSHENG OPTOELECTRONICS CO., LTD., Ordos, Inner Mongolia (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/381,244

(22) Filed: Apr. 11, 2019

(65) Prior Publication Data

US 2020/0082754 A1    Mar. 12, 2020

(30) Foreign Application Priority Data

Sep. 10, 2018    (CN) .......................... 2018 1 1050646

(51) Int. Cl.
*G09G 3/3225*    (2016.01)
*H01L 27/32*    (2006.01)
*H01L 51/50*    (2006.01)
*H01L 51/52*    (2006.01)

(52) U.S. Cl.
CPC ....... *G09G 3/3225* (2013.01); *H01L 27/3244* (2013.01); *H01L 51/5056* (2013.01); *H01L 51/5203* (2013.01)

(58) Field of Classification Search
CPC .............. G09G 3/3225; H01L 51/5203; H01L 51/5056; H01L 27/3244; H01L 27/3258; H01L 27/1259; H01L 27/1248
See application file for complete search history.

(56) References Cited

U.S. PATENT DOCUMENTS

| | | | |
|---|---|---|---|
| 6,455,891 B2 | 9/2002 | Shimomura et al. | |
| 7,459,786 B2 | 12/2008 | Shimazu et al. | |
| 10,147,747 B2* | 12/2018 | Toriumi | H01L 27/1225 |
| 10,320,959 B2* | 6/2019 | Wright | H04M 1/0202 |
| 2005/0009320 A1 | 1/2005 | Goundar | |
| 2008/0308911 A1* | 12/2008 | Okamoto | H01L 27/1255 257/623 |

(Continued)

FOREIGN PATENT DOCUMENTS

| | | |
|---|---|---|
| CN | 1716589 A | 1/2006 |
| CN | 104576651 A | 4/2015 |
| TW | 227542 B | 2/2005 |

OTHER PUBLICATIONS

First Chinese Office Action dated Mar. 26, 2020, received for corresponding Chinese Application No. 201811050646.5, 17 pages.

*Primary Examiner* — Ibrahim A Khan
(74) *Attorney, Agent, or Firm* — Kinney & Lange, P.A.

(57) ABSTRACT

A display panel, a method for preparing the same, and a display device are provided. The display panel, comprises a base substrate; a first insulating layer and a second insulating layer which are sequentially disposed on the base substrate, wherein a direction of a film stress of the first insulating layer is the same as a direction of a film stress of the second insulating layer.

9 Claims, 2 Drawing Sheets

(56) References Cited

U.S. PATENT DOCUMENTS

| | | | |
|---|---|---|---|
| 2012/0034451 A1* | 2/2012 | Seo | C23C 16/345 |
| | | | 428/332 |
| 2015/0108484 A1* | 4/2015 | Park | H01L 27/1255 |
| | | | 257/71 |
| 2016/0056179 A1* | 2/2016 | Toriumi | H01L 21/76801 |
| | | | 257/43 |
| 2017/0040406 A1* | 2/2017 | Park | H01L 51/56 |
| 2017/0077199 A1* | 3/2017 | Nguyen | H01L 27/3258 |
| 2019/0363290 A1* | 11/2019 | Watanabe | H01L 27/3276 |

\* cited by examiner

DISPLAY PANEL AND METHOD FOR PREPARING THE SAME, DISPLAY DEVICE

CROSS-REFERENCE TO RELATED APPLICATION

The present application claims the benefit of Chinese Patent Application No. 201811050646.5 filed on Sep. 10, 2018 in the State Intellectual Property Office of China, the whole disclosure of which is incorporated herein by reference.

TECHNICAL FIELD

The present disclosure relates to the field of display technologies, and in particular, to a display panel, a method for preparing the same, and a display device.

BACKGROUND

The active-matrix organic light emitting diode (AMOLED) display panel has advantages such as a relatively broad viewing angle and a relatively low power consumption. OLED devices, pixel circuits, signal lines, and the like are formed on the display substrate of the AMOLED display panel, and the pixel circuits are used to drive the OLED devices to emit light. A layer structure for forming the pixel circuit and the signal lines includes a plurality of metal layers and insulating layers interposed between the metal layers. For the insulating layer, a patterning process is not required, and therefore, a plurality of stacked insulating layers are formed in a part of the area of the display substrate, and an overall thickness of the plurality of insulating layers is relatively thin, and a peeling phenomenon tends to occur between two adjacent insulating layers, thereby causing a short circuit at overlapping locations between the metal layers, and in turn resulting in a display failure.

SUMMARY

According to an aspect of the present disclosure, there is provided a display panel, comprising: a base substrate; a first insulating layer and a second insulating layer which are sequentially disposed on the base substrate, wherein a direction of a film stress of the first insulating layer is the same as a direction of a film stress of the second insulating layer.

According to some embodiments of the present disclosure, the film stress of the first insulating layer and the film stress of the second insulating layer are both compressive stresses.

According to some embodiments of the present disclosure, the first insulating layer has a compressive stress of 500~700 Pascals, and the second insulating layer has a compressive stress of 500~700 Pascals.

According to some embodiments of the present disclosure, the first insulating layer comprises a silicon oxide film layer and a first silicon nitride film layer, and the second insulating layer comprises a second silicon nitride film layer.

According to some embodiments of the present disclosure, an active region is disposed under the first insulating layer, and a source region and a drain region located in the same layer as the active region and respectively located on either side of the active region;

a gate and a first storage electrode are further disposed at a same layer and are disposed on the first insulating layer;

the second insulating layer is disposed on the gate and the first storage electrode;

a second storage electrode is disposed at a position on the second insulating layer opposite to the first storage electrode.

According to some embodiments of the present disclosure, the display panel further comprises a via hole extending through the first insulating layer and the second insulating layer.

According to another aspect of the present disclosure, there is provided a method for preparing a display panel, comprising:

forming a first insulating layer and a second insulating layer sequentially on the substrate;

wherein, a direction of the film stress of the first insulating layer is set to be the same as a direction of the film stress of the second insulating layer.

According to some embodiments of the present disclosure, a film stress of the first insulating layer and a film stress of the second insulating layer are both compressive stresses.

According to some embodiments of the present disclosure, the first insulating layer comprises a silicon oxide film layer and a first silicon nitride film layer, and the second insulating layer comprises a second silicon nitride film layer;

the step of forming a first insulating layer and a second insulating layer sequentially on the substrate comprises:

depositing a silicon oxide film layer on the base substrate with a chemical vapor deposition equipment, so that the film stress of the silicon oxide film layer is a compressive stress;

depositing a first silicon nitride film layer on the silicon oxide film layer with a chemical vapor deposition equipment, and controlling a film forming pressure of the chemical vapor deposition equipment to be a set pressure value or a radio frequency power of the chemical vapor deposition equipment to be a set power value, so that the film stress of the first silicon nitride film layer is a compressive stress;

depositing a second silicon nitride film layer on the first silicon nitride film layer with the chemical vapor deposition equipment, and controlling a film forming pressure of the chemical vapor deposition equipment to be a set pressure value or the radio frequency power of the chemical vapor deposition equipment to be a set power value, so that the film stress of the second silicon nitride film layer is a compressive stress.

According to some embodiments of the present disclosure, the set pressure value is in a range of 900~1100 Pascals, or the set power value is in a range of 8800~11000 watts.

According to some embodiments of the present disclosure, before forming the first insulating layer, the method further comprises:

forming an active region under the first insulating layer, as well as a source region and a drain region located in the same layer as the active region and respectively located on either side of the active region;

after forming the first insulating layer, and before forming the second insulating layer, the method further comprises:

forming a gate and a first storage electrode on the first insulating layer; and after forming the second insulating layer, the method further comprises:

forming a second storage electrode at a position on the second insulating layer and opposite to the first storage electrode.

According to some embodiments of the present disclosure, after forming a second storage electrode at a position on the second insulating layer and opposite to the first storage electrode, the method further comprises: providing a via hole extending through the first insulating layer and the second insulating layer.

According to some embodiments of the present disclosure, after forming a second storage electrode at a position on the second insulating layer and opposite to the first storage electrode, the method further comprises: providing a first via hole extending through the first insulating layer and the second insulating layer at a position corresponding to the source region; and providing a second via hole extending through the first insulating layer and the second insulating layer at a position corresponding to the drain region.

According to another aspect of the present disclosure, there is provided a display device comprising above the display panel.

BRIEF DESCRIPTION OF THE DRAWINGS

The drawings herein are incorporated into the specification and form a part of the present specification, which illustrate some embodiments of the present disclosure and are used to explain the principles of the present disclosure together with the description.

DETAILED DESCRIPTION OF EMBODIMENTS

Figure 1:
FIG. 1 is a schematic cross-sectional view of a film layer formed on a substrate, a film stress of which is a tensile stress.

Exemplary embodiments will be described in detail herein, examples of which are illustrated in the accompanying drawings. Same reference signs refer to the same or similar components in the different drawings unless otherwise indicated. The embodiments described in the following exemplary embodiments do not represent all embodiments consistent with the present disclosure. Instead, they are merely examples of devices and methods consistent with aspects of the present disclosure or as detailed in the appended claims.

A pixel unit structure is typically disposed on the display panel. For example, for a display panel applied in an OLED display device, OLED devices, pixel circuits, signal lines, and the like are disposed on the display panel.

A plurality of OLED devices which are arranged in an array are typically disposed on the display panel, and one pixel circuit is disposed corresponding to each OLED device. The signal lines include rows of scan lines and columns of data lines. The scan lines are used to provide scan signals for each pixel circuit on the row, the data lines are used to provide data signals for each pixel circuit on the column, so as to drive the OLED devices to emit light.

The pixel circuit mainly includes a thin film transistor and a storage capacitor. A layer structure of the thin film transistor portion includes a gate electrode, a gate insulating layer, an active layer, an intermediate insulating layer, as well as a source and a drain. A layer structure of the storage capacitor portion includes a first storage electrode and a second storage electrode. An intermediate insulating layer is also formed between the first storage electrode and the second storage electrode.

When the gate insulating layer and the intermediate insulating layer are formed, it is not necessary to perform a patterning therefore, and thus, there is formed on a part of the display panel a gate insulating layer and an intermediate insulating layer which are directly stacked with each other. For example, the scan lines and the data lines are insulated by the stacked gate insulating layer and the intermediate insulating layer provided therebetween, and a stacked gate insulating layer and an intermediate insulating layer may also be formed in regions other than the thin film transistor and the storage capacitor.

Since the layer structure on the display panel is relatively complicated, especially the part of the pixel circuits, the scanning lines and the signal lines are densely arranged, and the thicknesses of the gate insulating layer and the intermediate insulating layer are relatively thin. A peeling phenomenon tends to occur between the gate insulating layer and the intermediate insulating layer, thereby causing a short circuit at intersections of the scanning lines and the data lines, or thereby affecting electrical properties of the pixel circuits and causing display defects such as display unevenness or white spots.

To solve the above problems, in some embodiments of the present disclosure, a display panel is provided, which comprises a base substrate; a first insulating layer and a second insulating layer which are sequentially disposed on the base substrate, wherein a direction of the film stress of the first insulating layer is the same as a the direction of the film stress of the second insulating layer.

The base substrate may be a rigid substrate or a flexible substrate. The material of the rigid substrate is, for example, glass, and the material of the flexible substrate is, for example, Polyimide (PI) polymer, Polycarbonate (PC) resin, and Polyethylene terephthalate (PET) plastic, and the like. The flexible substrate may be used to prepare a flexible display panel.

The first insulating layer and the second insulating layer are insulating layers formed on the base substrate for separating two adjacent metal layers, or separating the metal layer and the active layer. The first insulating layer is, for example, a gate insulating layer, and the second insulating layer is, for example, an intermediate insulating layer.

As described above, a stacked first insulating layer and a second insulating layer may be formed in a part of the display panel, in which part the first insulating layer and the second insulating layer are in direct contact with each other.

In general, the film is supported by the substrate to which it is bonded, and the film and the substrate form a unity of interaction. Such an interaction is embodied in two forms of forces, one is an adhesion force characterizing a bonding strength between contacting interfaces of the film and the substrate, the other is an acting force reflecting a constraint which is applied onto the interface of the film per unit area by the matrix and is referred to as a film stress.

Figure 2:
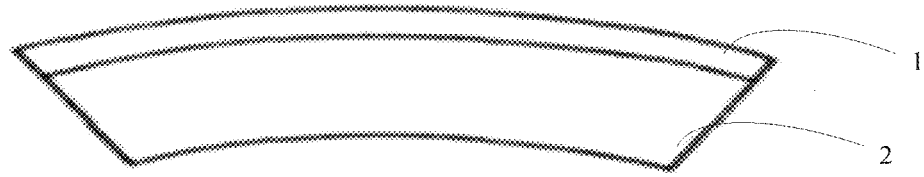
FIG. 2 is a schematic cross-sectional view of a film layer formed on the substrate, a film stress of which is a compressive stress.

The film stresses are internal stresses generated by interactions among molecules in the film, which are classified into tensile stresses and compressive stresses according to the direction of action. As shown in FIG. 1, if the film 1 tends to shrink along the interface between the film 1 and the substrate 2, then the film 1 is subjected to a tensile stress. In contrast, as shown in FIG. 2, if the film 1 tends to expand along the interface between the film 1 and the substrate 2, then the film 1 is subjected to a compressive stress.

The first insulating layer and the second insulating layer are thin films deposited on the base substrate, and the base substrate is a substrate to which the first insulating layer and the second insulating layer are bonded, and therefore, both the first insulating layer and the second insulating layer are subjected to film stress.

Figure 3:
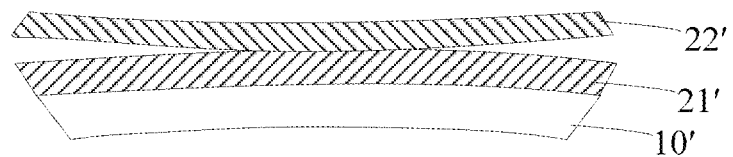
FIG. 3 is a schematic cross-sectional view of a display panel in related art.

After studying the peeling phenomenon between the first insulating layer and the second insulating layer in the display panel in the related art, it is found that the phenomenon occurs because, as shown in FIG. 3, a first insulating layer 21' and a second insulating layer 22' are formed on the base substrate 10', a film stress of the first insulating layer 21' is a compressive stress, and a film stress of the second insulating layer 22' is a tensile stress. Since the directions of the film stress of the two insulating layers are inconsistent, it may easily result in a consequence that the bonding strength between the first insulating layer 21' and the second insulating layer 22' is insufficient, and a peeling phenomenon tends to occur between the first insulating layer 21' and the second insulating layer 22'.

In this embodiment, for the first insulating layer and the second insulating layer disposed on the base substrate, in term of their respective microstructures, the first insulating layer and the second insulating layer have a same variation tendency, such a variation tendency is, for example, a shrinking tendency or an expansion tendency, the directions of the film stress of the first insulating layer and the second insulating layer are the same, the bonding strength between the first insulating layer and the second insulating layer may be improved, thereby avoiding the peeling phenomenon between the first insulating layer and the second insulating layer. The first insulating layer and the second insulating layer may serve to separate the signal lines from the scan lines on the display panel, and the gates from the active layer, thereby avoiding a short circuit occurring at the intersection of the scan lines and the data lines on the display panel. Further, the electrical properties of the pixel circuits are not affected by peeling of the first insulating layer and the second insulating layer, thereby improving the display uniformity of the image and avoiding display failure such as white spots, improving the display effect of the display image.

Figure 4:
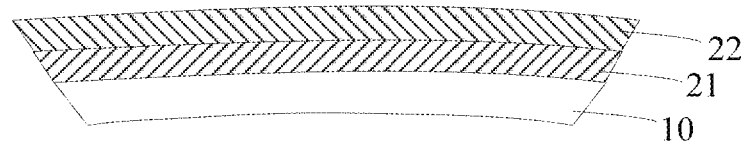
FIG. 4 is a schematic cross-sectional view of a display panel according to an embodiment of the present disclosure.

In some examples, referring to FIG. 4, for a first insulating layer 21 and a second insulating layer 22 disposed on the base substrate 10, both the film stress of the first insulating layer 21 and the film stress of the second insulating layer 22 are compressive stresses.

Figure 5:
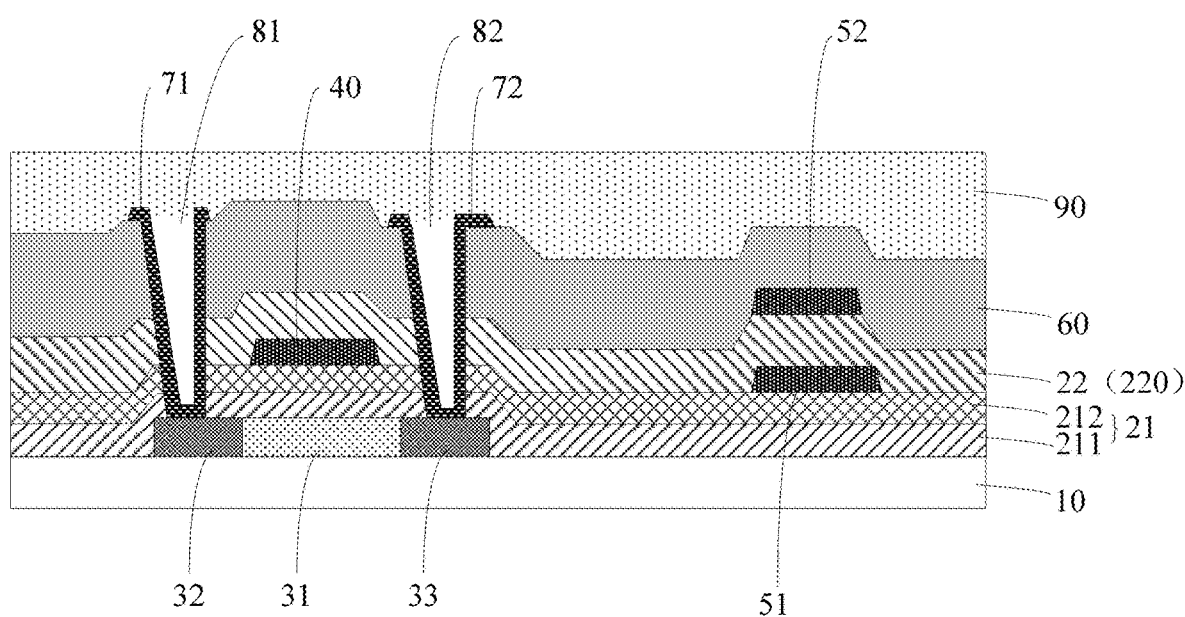
FIG. 5 is a schematic cross-sectional view of a display panel according to another embodiment of the present disclosure.

FIG. 5 is a schematic cross-sectional view of a display panel according to an embodiment of the present disclosure. Referring to FIG. 5, the display panel includes:

a base substrate 10;

an active region 31 on the base substrate 10, and a source region 32 and a drain region 33 which are located in the same layer as the active region 31 and are respectively located on either side of the active region 31, the first insulating layer 21, a gate electrode 40 and a first storage electrode 51 in the same layer, a second insulating layer 22 as well as a second storage electrode 52 which is located opposite to the position of the first storage electrode 51.

Further, in the display panel, an interlayer insulating layer 60 may be also disposed on the second storage electrode 52. The interlayer insulating layer 60 is further provided with a source 71 and a drain 72 thereon. A first via hole 81 extending through the interlayer insulating layer 60, the second insulating layer 22 and the first insulating layer 21 is further disposed at a position corresponding to the source region 32, and a second via hole 82 extending through the interlayer insulating layer 60, the second insulating layer 22 and the first insulating layer 21 is further disposed at a position corresponding to the drain region 33. The source 71 is electrically connected to the source region 32 through the first via hole 81, and the drain 72 is electrically connected to the drain region 33 through the second via hole 82. A planarization layer 90 may also be formed on the interlayer insulating layer 60.

In the display panel, the first storage electrode 51, the second storage electrode 52, and the second insulating layer 22 between the first storage electrode 51 and the second storage electrode 52 may form collectively a storage capacitor, which may serve as a capacitor in a pixel circuit.

The active region 31, the source region 32 and the drain region 33 on either side of the active region 31, the first insulating layer 21, the gate 40, the second insulating layer 22, and a region where the source 71 and the drain 72 are located may form collectively a structure of a thin film transistor.

The analysis of the film stress of the first insulating layer and the second insulating layer in the related art demonstrates that the film stress of the first insulating layer 21 is a compressive stress, and the film stress of the second insulating layer 22 is a tensile stress.

The first insulating layer 21 is an insulating layer for being disposed between the active region 31 and the gate 40, and the second insulating layer 22 is an insulating layer used as a dielectric layer of a storage capacitor. The film property of the first insulating layer directly affects the electrical properties of the thin film transistor, thereby affecting the performance of the pixel circuit. Therefore, in order to avoid the influence on the pixel circuits due to a variation of the film property of the first insulating layer, the film property of the second insulating layer is changed, so as to change the film stress of the second insulating layer from the tensile stress to the compressive stress, such that not only the influence on the pixel circuits may be decreased, but also the first insulating layer and the second insulating layer may be prevented from being separated from each other.

A specific manner of changing the film properties of the second insulating layer may be changing the film forming conditions of the second insulating layer, for example, a temperature of the base substrate, a film forming pressure, a deposition rate, and the like.

In some examples, as shown in FIG. 5, aforementioned first insulating layer 21 includes a silicon oxide film layer 211 and a first silicon nitride film layer 212, which are sequentially disposed on the base substrate, and the second insulating layer 22 includes a second silicon nitride film layer 220.

A two-layer film layer formed collectively by the silicon oxide film layer 211 and the first silicon nitride film layer 212 is a first insulating layer, and the first insulating layer is applicable to function as a gate insulating layer, and the gate insulating layer may be used for being disposed between the active layer and the gate of the thin film transistor on a display panel.

The second insulating layer is a single film layer formed by the second silicon nitride film layer 220, and the second insulating layer is suitable to be used as a dielectric layer of a storage capacitor, the second insulating layer being disposed between the first storage electrode and the second storage electrode on the display panel.

In some examples, the first insulating layer has a compressive stress of 500~700 Pascals (Pa) and the second insulating layer has a compressive stress of 500~700 Pascals (Pa).

An experimental study proves that the film stress in the above numerical range may significantly improve the problem that the first insulating layer and the second insulating layer are separated from each other, reduce the white spot in the display image, and reduce the short circuit between the signal lines and the data lines.

The embodiment of the present disclosure further provides a method for preparing a display panel, including:

forming a first insulating layer and a second insulating layer sequentially on the base substrate.

the direction of the film stress of the first insulating layer is the same as the direction of the film stress of the second insulating layer.

In an optional embodiment, the first insulating layer includes a silicon oxide film layer and a first silicon nitride film layer, and the second insulating layer includes a second silicon nitride film layer.

Above step of forming the first insulating layer and the second insulating layer sequentially on the base substrate includes:

depositing a silicon oxide film layer on the base substrate with a chemical vapor deposition equipment, so that the film stress of the silicon oxide film layer is a compressive stress;

depositing a first silicon nitride film layer on the silicon oxide film layer with a chemical vapor deposition equipment, and controlling a film forming pressure of the chemical vapor deposition equipment to be a set pressure value or a radio frequency power of the chemical vapor deposition equipment to be a set power value, so that the film stress of the first silicon nitride film layer is a compressive stress;

depositing a second silicon nitride film layer on the first silicon nitride film layer with a chemical vapor deposition equipment, and controlling a film forming pressure of the chemical vapor deposition equipment to be a set pressure value or the radio frequency power of the chemical vapor deposition equipment to be a set power value, so that the film stress of the second silicon nitride film layer is a compressive stress.

In this embodiment, the silicon oxide film layer, the first silicon nitride film layer and the second silicon nitride film layer are formed by a chemical vapor deposition method, and the chemical vapor deposition method is a film forming method, which mainly uses one or more kinds of gas phase compound or elemental substance containing the film element and performs a chemical reaction on the surface of a base substrate to form a film.

When depositing the above film layer with the chemical vapor deposition method, it is necessary to utilize a chemical vapor deposition equipment, which may control process parameters for implementing the film forming, and the process parameters directly affect the film stress level of the formed film layer, and the process parameters include, for example, a temperature of the base substrate, a film forming pressure, a deposition rate, and the like. The film stress level of the formed film layer may be controlled by controlling the above process parameters.

As to an influence of the film forming pressure on the film stress, as the gas pressure in the reaction chamber of the equipment is increased (i.e., the film forming pressure is increased), the concentration of high energy particles is increased, so that degrees of freedom of the gas molecules are increased, and there is a serious scattering phenomena of the gas molecules colliding with each other, reducing the energy of gas molecules, which may increase a tilt component of the precipitated particle flow, and in turn cause the film layer structure to be loose, with the compressive stress becoming smaller and smaller, and the film stress being changed into a tensile stress; in contrast, as the gas pressure in the reaction chamber is decreased (i.e., the film forming pressure is decreased), the concentration of high energy particles is reduced, so that the degrees of freedom of the gas molecules are reduced, which may increase the energy of the gas molecules, and reducing the tilting component of the precipitated particle flow, and in turn cause the film layer structure to be tight, with the compressive stress becoming larger and larger, and the film stress being a compressive stress.

As to an influence of the Radio Frequency (RF) power of the equipment on the film stress, as the RF power changes, kinetic energy of the deposited atoms also change, and a defect concentration of an interface diffusion layer structure and a film layer structure also changes accordingly. Therefore, the film stresses will also change.

A deposition rate during film forming also has an influence on the film stress. It has been found through experiments that the film stresses of some films are increased as the deposition rate is increased, while other films have an opposite effect. Generally, the larger the deposition rate is, the more defects exist in the film, the higher is the stress. However, during the deposition, if the surrounding gas and the deposited atoms undergo a significant chemical reaction and form a film with a disordered structure, as less surrounding gas enters other molecules at high deposition rates, the film stress is reduced, so the influence of the deposition rate on the film stress is determined according to the condition of the film material as required.

In this embodiment, the film stresses of the silicon oxide film layer, the first silicon nitride film layer and the second silicon nitride film layer are set to be compressive stress mainly by controlling the film forming pressure or the radio frequency power of the chemical vapor deposition equipment (hereinafter referred to as 'the equipment'). For forming a silicon oxide film layer, the equipment may adopt both film forming pressure and RF power as previously set, which are not limited herein.

For forming the first silicon nitride film layer, the equipment may also adopt the existing film forming pressure and RF power as previously set, so that the film stress applied on the formed first silicon nitride film layer may be a compressive stress. For the second silicon nitride film layer, if the equipment adopts the film forming pressure and RF power as previously set, the film stress applied on the formed second silicon nitride film layer is a tensile stress. Therefore, in this embodiment, the film forming pressure (or radio frequency power) of the equipment as previously set upon forming the second silicon nitride film layer is changed, so that the film forming pressure (or RF power) upon forming the second silicon nitride film layer and the film forming pressure (or RF power) upon forming the first silicon nitride film layer are the same, thus the film stress applied on the formed second silicon nitride film layer may be a compressive stress.

The film forming pressure as above is a set pressure value or the radio frequency power as above is a set power value, in which the set pressure value or the set power value may be set experimentally or empirically.

In following two tables, there are datum of the film stresses of the first silicon nitride layer and the second silicon nitride film layer formed by the chemical vapor deposition equipment in the related art, and the film forming pressure and the RF power corresponding to the equipment:

|  | first silicon nitride film layer | second silicon nitride film layer |
|---|---|---|
| film stress | −500 Pa | 200~500 Pa |
| film forming pressure | 1100 Pa | 1600~1800 Pa |
| film stress radio frequency power | −500 Pa 8800 Pa | 200~500 Pa 3600~4800 Pa | a. In following two tables, there are datum of the film stresses of the first silicon nitride layer and the second silicon nitride film layer formed by the chemical vapor deposition equipment in the method of the present embodiment, and the film forming pressure and the RF power corresponding to the equipment:

|  | first silicon nitride film layer | second silicon nitride film layer |
|---|---|---|
| film stress | −500 Pa | −700~−500 Pa |
| film forming pressure | 1100 Pa | 900~1100 Pa |
| film stress radio frequency power | −500 Pa 8800 Pa | −700~−500 Pa 8800~11000 Pa |

Negative values of the film stresses in the above tables indicate that the film stresses are compressive stresses, and positive values of the film stresses indicate that the film stresses are tensile stresses.

It may be known from the datum in the above table that, in this embodiment, what is mainly changed is the film forming pressure or the radio frequency power of the equipment upon forming the second silicon nitride layer. The tensile stress of the second silicon nitride layer is changed to a compressive stress by reducing the film forming stress of the equipment from 1600~1800 Pa as previously set to 900~1100 Pa upon forming the second silicon nitride film layer, or by increasing the RF power of the film forming equipment from 3600~4800 Pa as previously set to 8800~11000 Pa upon forming the second silicon nitride film layer.

In this embodiment, it is only needed to change the film forming pressure or the radio frequency power of the equipment upon forming the second silicon nitride layer, so that the film stress of the base substrate to the second silicon nitride layer may be changed from a tensile stress to a compressive stress, which may significantly improve the problem of peeling between the first insulating layer and the second insulating layer. It is proved by experiments that the display panel prepared by the method may reduce the white spot defect rate of the display image of the display panel from 4% to less than 1%, and the white spot defect rate of the display panel may be maintained at a level of less than 0.5%, and the short circuit problems between the signal lines and the data lines are also significantly reduced, and the improvement effect on the display screen is very obvious and easy to implement.

In some examples, the method further includes: before forming the first insulating layer:

forming an active region on the base substrate as well as a source region and a drain region which are in the same layer as the active region and are respectively located on either side of the active region.

After forming the first insulating layer, and before forming the second insulating layer, the method further includes:

forming a gate and a first storage electrode on the first insulating layer.

After forming the second insulating layer, the method further includes:

forming a second storage electrode at a position on the second insulating layer opposite to the first storage electrode.

With the method of the embodiment, the display panel as shown in FIG. 5 may be prepared, and the method specifically includes the following steps:

Step S1, forming an active region 31, a source region 32 and a drain region 33 on the base substrate 10.

Specifically, a polysilicon layer may be formed on the base substrate firstly, and then the polysilicon layer is patterned to retain portions of the polysilicon layer for forming the active region, the source region, and the drain region.

Then, the retained portions of the polysilicon layer for forming the source region and the drain region are metallized so that the portions of the polysilicon layer for forming the source region and the drain region is changed into a conductor layer, thereby forming the source region and the drain region, the retained portion of the polysilicon layer which is not metallized functions as an active region, and such an active region may serve as an active layer of the thin film transistor.

Step S2, forming a first insulating layer 21 on the active region 31, the source region 32 and the drain region 33.

Specifically, the first insulating layer 21 includes a silicon oxide film layer 211 and a first silicon nitride film layer 212, and a silicon oxide film and a first silicon nitride film layer may be sequentially deposited on the active region, the source region and the drain region with the chemical vapor deposition method. During such a process, referring to the above description, by controlling a film forming pressure or a radio frequency power of the equipment, the film stresses of the formed silicon oxide film layer and the first silicon nitride film layer are compressive stresses.

Step S3, forming a gate 40 and a first storage electrode 51 on the first insulating layer 21.

Specifically, a metal layer may be formed on the first insulating layer firstly; then the metal layer is patterned, and remaining portions of the metal layer form a gate and a first storage electrode.

Step S4, forming a second insulating layer 22 on the gate 40 and the first storage electrode 51.

Specifically, the second insulating layer 22 includes a second silicon nitride film layer 220, and a second silicon nitride film layer may be deposited on the gate and the first storage electrode with the chemical vapor deposition method. During such a process, referring to the above description, by controlling a film forming pressure or a radio frequency power of the equipment, the film stress of the formed second silicon nitride film layer is a compressive stress.

Step S5, forming a second storage electrode 52 on the second insulating layer 22.

Specifically, a metal layer may be formed on the second insulating layer firstly; then the metal layer is patterned, and a portion of the metal layer opposite to the first storage electrode is retained to form a second storage electrode.

Further, the interlayer insulating layer, the source and the drain may be further formed, and specifically, the following steps are further included:

Step S6, forming an interlayer insulating layer 60 on the second storage electrode 52;

a layer of insulating material may be deposited on the second storage electrode 52 with the chemical vapor deposition method, which layer may serve as an intermediate insulating layer.

Step S7, respectively forming a first via hole 81 and a second via hole 82 extending through the interlayer insulating layer 60, the second insulating layer 22 and the first insulating layer 21 in a portion corresponding to the source region 32 and the drain region 33;

Step S8, forming a source 71 and a drain 72 on the interlayer insulating layer 60;

Specifically, a metal layer may be formed on the interlayer insulating layer 60 firstly, and the material of the metal layer is filled in the first via hole and the second via hole; then the metal layer is patterned, and a remaining portion of the metal layer forms the source and the drain. Furthermore, the drain 71 is electrically connected to the source region 32 through the first via hole 81, and the drain 72 is electrically connected to the drain region 33 through the second via hole 82.

The patterning process includes, for example, a process of coating, exposing, developing, etching, and/or peeling of the photoresist, which is a well-known process, and the specific process will not be described herein.

The display panel may further include other film layers. For example, for the display panel used in the OLED display device, the source and the drain as above may further form a planarization layer 90, a pixel defining layer and the like, as well as various layers of organic light emitting diodes, for example, an anode layer, an organic light-emitting layer, and a cathode layer, etc., without limiting other film layers included in the display panel.

It should be noted that, for the film stresses of the first insulating layer and the second insulating layer, FIGS. 3 and 4 are schematic views at enlarged dimensions, which are schematically shown from a microscopic perspective, and for FIG. 5, a positional relationship among the respective film layers is schematically shown from a more macroscopic perspective, which does not necessarily represent the actually formed film layer shape.

The embodiment of the present disclosure further provides a display device, comprising: the display panel according to any of the above embodiments.

The display device described above includes the display panel described in the above embodiments. The display device may be used as any product or component having display function, such as electronic paper, mobile phone, tablet computer, television, display, laptop computer, digital photo frame, navigator, and wearable device.

The present disclosure is intended to cover any variations, utilities, or adaptations of the present disclosure, which are in accordance with the general principles of the present disclosure and include common general knowledge or conventional technical means in the art that are not disclosed in the present disclosure. The specification and examples are to be regarded as illustrative only, and the true scope and spirit of the disclosure are defined by the appended claims.

What is claimed is:

1. A display panel, comprising:
    a base substrate; and
    a first insulating layer and a second insulating layer which are sequentially disposed on the base substrate, wherein a direction of a film stress of the first insulating layer is the same as a direction of a film stress of the second insulating layer,
    wherein the first insulating layer has a compressive stress of 500~700 Pascals, and the second insulating layer has a compressive stress of 500~700 Pascals.

2. The display panel according to 1, wherein:
    the first insulating layer comprises a silicon oxide film layer and a first silicon nitride film layer, and the second insulating layer comprises a second silicon nitride film layer.

3. The display panel according to 1, wherein:
    an active region is disposed under the first insulating layer, and a source region and a drain region are located in the same layer as the active region and respectively located on opposite sides of the active region;
    a gate and a first storage electrode are further disposed at a same layer and are disposed on the first insulating layer;
    the second insulating layer is disposed on the gate and the first storage electrode; and
    a second storage electrode is disposed at a position on the second insulating layer opposite to the first storage electrode.

4. The display panel according to 1, further comprising a via hole extending through the first insulating layer and the second insulating layer.

5. A display device comprising: the display panel according to claim 1.

6. A method for preparing a display panel, comprising:
    forming a first insulating layer and a second insulating layer sequentially on a substrate, the first insulating layer comprising a silicon oxide film layer and a first silicon nitride film layer, and the second insulating layer comprising a second silicon nitride film layer;
    wherein, a direction of a film stress of the first insulating layer is set to be the same as a direction of a film stress of the second insulating layer, and
    wherein the step of forming the first insulating layer and the second insulating layer sequentially on the substrate comprises:
        depositing the silicon oxide film layer on the base substrate with chemical vapor deposition equipment, so that the film stress of the silicon oxide film layer is a compressive stress;
        depositing the first silicon nitride film layer on the silicon oxide film layer with the chemical vapor deposition equipment, and controlling a film forming pressure of the chemical vapor deposition equipment to be in a range of 900~1100 Pascals or controlling a radio frequency power of the vapor deposition equipment to be in a range of 8800~11000 Watts, so that the film stress of the first silicon nitride film layer is a compressive stress; and
        depositing the second silicon nitride film layer on the first silicon nitride film layer with the chemical vapor deposition equipment, and controlling the film forming pressure of the chemical vapor deposition equipment to be in a range of 900~1100 Pascals or controlling the radio frequency power of the chemical vapor deposition equipment to be in a range of 8800~11000 Watts, so that the film stress of the second silicon nitride film layer is a compressive stress.

7. The method according to claim 6, wherein:
    before forming the first insulating layer, the method further comprises:
        forming an active region under the first insulating layer, as well as a source region and a drain region located in the same layer as the active region and respectively located on opposite sides of the active region;

after forming the first insulating layer, and before forming the second insulating layer, the method further comprises:

forming a gate and a first storage electrode on the first insulating layer; and after forming the second insulating layer, the method further comprises:

forming a second storage electrode at a position on the second insulating layer and opposite to the first storage electrode.

8. The method according to claim 7, wherein after forming the second storage electrode at the position on the second insulating layer and opposite to the first storage electrode, the method further comprises:

providing a via hole extending through the first insulating layer and the second insulating layer.

9. The method according to claim 7, wherein after forming the second storage electrode at the position on the second insulating layer and opposite to the first storage electrode, the method further comprises:

providing a first via hole extending through the first insulating layer and the second insulating layer at a position corresponding to the source region; and providing a second via hole extending through the first insulating layer and the second insulating layer at a position corresponding to the drain region.

* * * * *